(12) United States Patent
Chiu et al.

(10) Patent No.: US 8,283,108 B2
(45) Date of Patent: Oct. 9, 2012

(54) METHOD OF APPLYING PATTERNED METALLIZATION TO BLOCK FILTER RESONATORS

(75) Inventors: Luna H. Chiu, Ellicott City, MD (US); Chen Zhang, Clarksville, MD (US); John King, Ellicott City, MD (US); Barry Treadway, Gaithersburg, MD (US); George Kang, Newark, DE (US)

(73) Assignee: Research in Motion RF, Inc., Wilmington, DE (US)

( * ) Notice: Subject to any disclaimer, the term of this patent is extended or adjusted under 35 U.S.C. 154(b) by 680 days.

(21) Appl. No.: 11/725,313

(22) Filed: Mar. 19, 2007

(65) Prior Publication Data

US 2007/0184391 A1    Aug. 9, 2007

Related U.S. Application Data

(62) Division of application No. 10/736,467, filed on Dec. 15, 2003, now abandoned.

(60) Provisional application No. 60/445,350, filed on Feb. 5, 2003.

(51) Int. Cl.
*H01P 3/02* (2006.01)

(52) U.S. Cl. ......... 430/311; 430/313; 430/198; 333/206

(58) Field of Classification Search ..................... None
See application file for complete search history.

(56) References Cited

U.S. PATENT DOCUMENTS

| | | | |
|---|---|---|---|
| 4,760,351 A * | 7/1988 | Newell et al. ................... 331/48 |
| 4,901,136 A * | 2/1990 | Neugebauer et al. ......... 257/691 |
| 5,312,790 A | 5/1994 | Sengupta et al. ............. 501/137 |
| 5,427,988 A | 6/1995 | Sengupta et al. ............. 501/137 |
| 5,486,491 A | 1/1996 | Sengupta et al. ............. 501/137 |
| 5,593,495 A | 1/1997 | Masuda et al. ..................... 117/4 |
| 5,635,433 A | 6/1997 | Sengupta ....................... 501/137 |
| 5,635,434 A | 6/1997 | Sengupta ....................... 501/138 |
| 5,640,042 A | 6/1997 | Koscica et al. ................ 257/595 |
| 5,693,429 A | 12/1997 | Sengupta et al. ............. 428/699 |
| 5,694,134 A | 12/1997 | Barnes .......................... 343/700 |
| 5,766,697 A | 6/1998 | Sengupta et al. ............. 427/585 |
| 5,830,591 A | 11/1998 | Sengupta et al. ............. 428/701 |
| 5,846,893 A | 12/1998 | Sengupta et al. ............. 501/137 |
| 5,886,867 A | 3/1999 | Chivukula et al. ........... 361/311 |
| 5,990,766 A | 11/1999 | Zhang et al. .................. 333/205 |
| 6,074,971 A | 6/2000 | Chiu et al. .................... 501/139 |
| 6,377,142 B1 | 4/2002 | Chiu et al. .................... 333/238 |
| 6,377,217 B1 | 4/2002 | Zhu et al. ...................... 343/700 |
| 6,377,440 B1 | 4/2002 | Zhu et al. ...................... 361/311 |
| 6,404,614 B1 | 6/2002 | Zhu et al. ...................... 361/277 |
| 6,492,883 B2 | 12/2002 | Liang et al. ................... 333/132 |
| 6,514,895 B1 | 2/2003 | Chiu et al. .................... 501/137 |
| 6,525,630 B1 | 2/2003 | Zhu et al. ...................... 333/205 |
| 6,531,936 B1 | 3/2003 | Chiu et al. .................... 333/164 |
| 6,535,076 B2 | 3/2003 | Partridge et al. ............. 333/17.1 |
| 6,538,603 B1 | 3/2003 | Chen et al. .................... 342/372 |
| 6,556,102 B1 | 4/2003 | Sengupta et al. ............. 333/161 |
| 6,590,468 B2 | 7/2003 | du Toit et al. ................ 333/17.3 |
| 6,597,265 B2 | 7/2003 | Liang et al. ................... 333/204 |

\* cited by examiner

*Primary Examiner* — Daborah Chacko Davis
(74) *Attorney, Agent, or Firm* — Guntin Meles & Gust, PLC; Andrew Gust

(57) ABSTRACT

An embodiment of the present invention provides a method of applying patterned metallization to a ceramic block comprising applying a photodefinable ink to said ceramic block; drying said ink; exposing said photodefinable ink to UV radiation through a predefined mask according to the thickness of the film to form a pattern; developing said pattern in a developer solution thereby forming a patterned ceramic block; and rinsing, drying and firing said patterned ceramic block.

20 Claims, 12 Drawing Sheets

| Process Steps | Photo-Define | Screen-Print | Etching | Typical Semi-conductor patterning | Laser Patterning |
|---|---|---|---|---|---|
| Apply wet metal | Yes | Yes | Yes | No | Yes |
| Drying of metal/photoresist | Yes | Yes | Yes | Yes | Yes |
| Exposing of metal or photoresist | Yes | No | Yes | Yes | No |
| Developing of metal or photoresist | Yes | Yes | Yes | Yes | No |
| Firing of Metal | Yes | Yes | Yes | No | Yes |
| Further trimming to obtain correct dimensions (not RF trimming) | No | Yes limited in dimensions | No | No | Limited to laser spot size |
| Vacuum Metallization (limited in deposition thicknesses) | No | No | No | Yes | No |
| Chemical Etching | No | No | Yes | Yes | No |
| Post Annealing/Cleaning | No | Yes | Yes | Yes | Yes |

FIGURE 12

METHOD OF APPLYING PATTERNED METALLIZATION TO BLOCK FILTER RESONATORS

CROSS-REFERENCE TO RELATED APPLICATION

This application is a divisional of U.S. patent application Ser. No. 10/736,467, filed Dec. 15, 2003 now abandoned, entitled, "METHOD OF APPLYING PATTERNED METALLIZATION TO BLOCK FILTER RESONATORS" to Chiu et al. which claimed priority to US Provisional Patent Application Ser. No. 60/445,350, "METHOD OF APPLYING PATTERNED METALLIZATION TO BLOCK FILTER RESONATORS" filed Feb. 5, 2003, by Luna H. Chiu.

BACKGROUND OF THE INVENTION

The present invention generally relates to metallization, patterning of electrodes onto block type filters, diplexers and resonators. The photo-definition method is especially useful on small resonators having any dimension less than 4 mm in size.

The concept of RF ceramic block type filters is well known in the art. Ceramic block filters are constructed of a high Q ceramic material and are typically coupled to other electronic circuitry through solder mounting pads, wires, cables and pins coupled to conductive connection points on external surfaces of the blocks. These ceramics are also used to construct duplexers and other electronic components. The production of block filters starts with a ceramic resonator, typically a square or rectangular part having a length, width and height, and in most cases this resonator will have a through hole in the center. The dimensions of the width and height are usually the same in a single resonator and these two dimensions define the profile of the block. Once the ceramic block is made, metallization (usually silver) is placed on all surfaces including the inside surface of the through hole. This is normally performed via a dip coating method. Typically, vendors of resonator products will then sand or blast off the metallization on the top surface only. Patterning of surfaces is usually not a provided service.

In prior art, a ceramic block is sintered and then blanket metallization is usually placed using a dip coating method. Then the sides that require metallization patterning are cleaned off or left uncoated. The patterning is traditionally performed by screen printing features directly on substrates followed by a firing step. However, in the present invention and devices of similar size, screen printing can not be used due to the feature sizes and tolerances required. For example, the block part itself is a 3 mm×3 mm square and in some cases the corners are rounded instead or square with a center through hole. The required spacing feature size was less than 4 mm with line sizes less than 10 mm. To ensure a good print with good edge definition and tolerances, this would be very expensive and nearly impossible. Also, due to the fact that the filter of the present invention is designed for 1.8-2.3 GHz range, the tolerances required are much more stringent than standard screen printing usually allows.

Another method in prior art for applying a pattern to a block ceramic filter is through a subtractive process such as chemical etching or laser ablation to take off the excess metal in order to obtain a pattern on the ceramic block. In the case of chemical etching of the metal, it is possible that the solutions used can adversely affect the ceramic material surrounding the pattern. Also because this step would be done post firing, the etching chemicals used are usually harsher than the method defined in this invention. For this process it would be difficult to produce a pattern on a rounded corner block.

Therefore, a strong need in the industry exists for a novel method to apply to metal etching.

SUMMARY OF THE INVENTION

The present invention provides an electric communication signal block resonator, comprising a block of dielectric materials having an outside surface including a top surface, a bottom surface, and at least first and second side surfaces. The block defines at least one through-hole and each through-hole extends from an opening in the bottom surface to an opening in the top surface. Further, a metallization is deposited via a photodefinable process onto said block. The metallization includes input/output coupling metallization deposited via a photodefinable process as well as metallization of tunable varactors deposited via a photodefinable process. The electric communication signal block resonator can further include at least one additional block of dielectric materials having an outside surface including a top surface, a bottom surface, and at least first and second side surfaces. The at least one additional block defining at least one through-hole, each through-hole extending from an opening in said bottom surface to an opening in said top surface and wherein a metallization is deposited via a photodefinable process onto said at least one additional block; and said block of dielectric material and said at least one additional block of dielectric material are connected via an iris between said block of dielectric material and said at least one additional block of dielectric material.

The present invention also provides for an RF filter. The RF filter comprising a block of dielectric material; said block of dielectric material having an electrode pattern that adheres to at least one surface of said block; said electrode pattern consisting of a photodefinable metallization covering at least one surface of said block of dielectric material converted to a photodefined patterned metallization on at least one surface of said dielectric material. The aforementioned RF filter can also provide the electrode pattern consisting of a photodefinable metallization covering at least one surface of said block of dielectric material converted to a photodefined patterned metallization on at least one surface of said dielectric material. Further, the electrode pattern can consist of a photodefinable metallization covering all surfaces of said block of dielectric material converted to a photodefined patterned metallization on from one to all surfaces of said dielectric material. The metallization of the RF filter can include input/output coupling metallization deposited via a photodefinable process or can include metallization of tunable varactors deposited via a photodefinable process. The unique properties of the present invention provide that at least one of said photodefined metallic patterned surfaces are less than 4 mm square.

Also, the present invention provides a method of applying patterned metallization to a ceramic block comprising the steps of: applying a photodefinable ink to said ceramic block; drying said ink; exposing said photodefinable ink to UV radiation through a predefined mask according to the thickness of the film to form a pattern; developing said pattern in a developer solution thereby forming a patterned ceramic block; and rinsing, drying and firing said patterned ceramic block. This method can provide that said ceramic block is an electric communication signal block resonator or wherein said pattern provides inter-cavity coupling between adjacent and non-adjacent cavities of said ceramic blocks and finally wherein said pattern defines an electrode pattern to produce an RF input and output for said electric communication block resonator. The method can also provide that said ceramic block is a waveguide aperture and said pattern provides a coupling probe that can be either electric or magnetic. Further, the pattern can be a metallization patterns for solder mounting pads on said ceramic blocks. The pattern of the present method can provide for metallization in conjunction with tunability thus reducing the need for trimming of metal to obtain the correct frequency.

Because of the processes of the present method, it can be used on rounded or square sides and on sizes of less than 4 mm.

BRIEF DESCRIPTION OF THE DRAWINGS

FIG. 12 shows the process comparison benefits of the photodefined process illustrates a layout of the multilayer filter of the present invention.

DESCRIPTION OF THE PREFERRED EMBODIMENT

It is an object of the present invention to provide a new means to produce a metal pattern on single or multiple faces of a ceramic block based filter. The ceramic block filter can be either a fixed filter or tunable block filters.

The present invention is related to the system and process of placing metallization patterns on small electronically tunable filters made in dielectric block form. The system and method of metallization of course can be performed on a fixed block filter as well. The tuning elements can be voltage-controlled tunable dielectric capacitors placed on the ceramic block. Alternatively, MEMS varactors or diode varactors can be used to make tunable filters, although with limited applications. The actual metallization pattern given as an example in this invention is unique to the tunable filter using tunable dielectric capacitors; however, as mentioned above, the process described herein can be used in any type of block filter, tunable or fixed.

Patterning of surfaces on the block filter resonator is usually needed for many designs. For example, on a block filter, well defined solder pads need to be separated from the rest of the resonator metallization. Other defined metallization patterns could include I/O pad generation, coupling lines, aperture windows and tuning lines.

The aforementioned difficulties are overcome in the present invention by providing a novel method to apply to metal etching. In the laser ablation method, it has been known that the directed energy of the laser causes adverse Q effects during the lasing process. Subsequently, the material would require heat treatment. The size of features required for higher frequency can be much smaller than the spot size of an ablating laser. Therefore this method of patterning may be limited as the block filters shrink down to below 2 mm in profile.

A third way to produce a pattern (however, this method is not normally used in the block filter industry) is to use standard semiconductor photo methods to pattern metal. However, this solution is usually more expensive and time consuming.

The present method is unique and a combination between a thick film and semiconductor approach. The tunable block filter, which was made using this new process consists of a ceramic block with metallization in some areas to form a coaxial combline structure.

Figure 1:
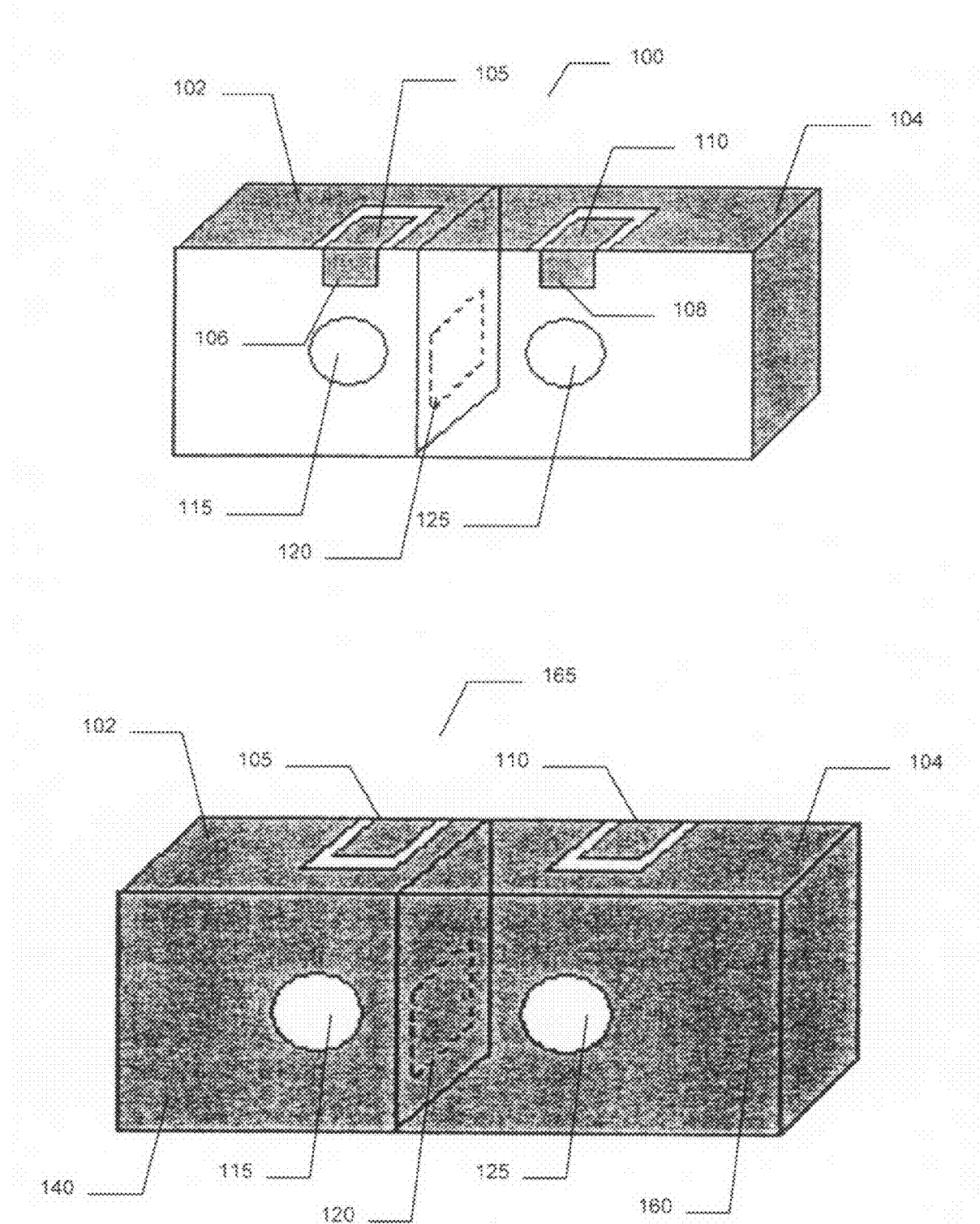
FIG. 1 shows a two-pole coaxial combline block filter.

Turning now to the figures, FIG. 1 shows a front view of a two-pole filter 100 of the present invention. It consists of two coaxial combline resonators 102 and 104 coupled to each other through an iris 120. One end of the resonators 102 and 104 is open and the other end is short. The access coupling to the resonators 102 and 104 is achieved by a probe, which consists of a metallizing part of the dielectric at the open end of the resonators, as shown in FIG. 1 at 106 and 108. All other surfaces are metallized ground. The input/output coupling metallization 105 and 110 has been extended to the perpendicular surface and isolated as shown for SMD applications. Also depicted in FIG. 1 in the front view are the metallized through holes in the ceramic blocks at 115 and 125.

Shown at 165 is the back view of the two pole filter 100 with a view of resonators 105 and 110 shown from the back. Again, the input/output coupling metallization shown in this depiction as 105 and 110 has been extended to the perpendicular surface and isolated as shown for SMD applications. The metallized surface for ground can be seen in the back view as 140 and 160 for respective resonators. The back end of metallized through holes 115 and 125 can be seen in this back view as well.

Figure 2:
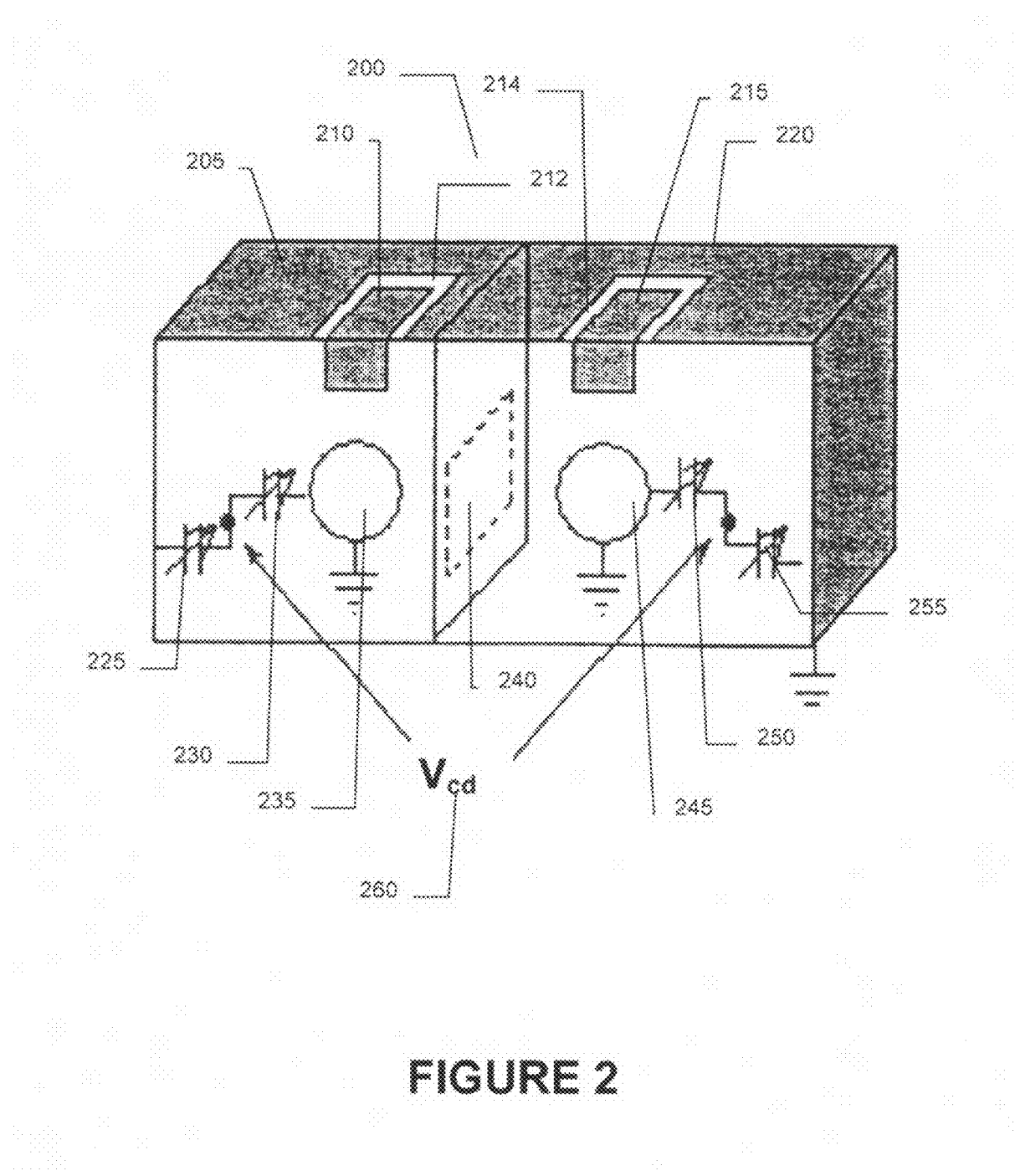
FIG. 2 shows a tunable two-pole coaxial combline block filter.

Filters with a higher number of poles can be made by simply adding more resonators between the two resonators as shown in FIG. 2 at 200 with resonators 205 and 220 coupled by iris 240. Metallized through holes in the ceramic are depicted at 235 and 245 and tunable varactors are integrated with resonators at 230 and 250. Additional tunable varactors can be added as well as shown at 225 and 255 with DC bias voltage provided at 260. Again, input/output coupling metallization is depicted at 210 and 215 with areas of non-metallization used for isolation shown at 212 and 214.

Figure 3:
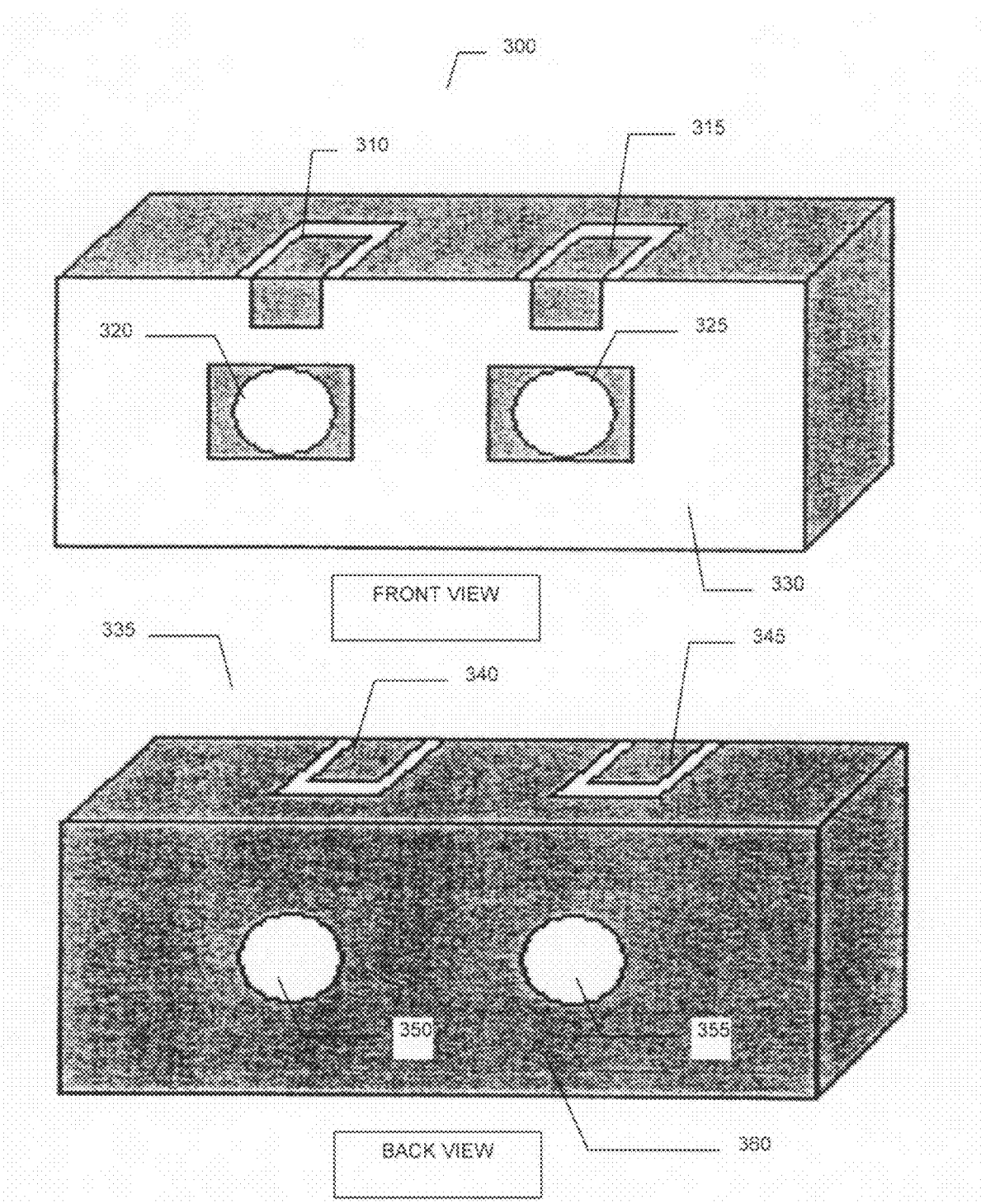
FIG. 3 shows the response of the tunable coaxial combline filter with no bias.

The tunable block filter can be achieved in another form in which there is no coupling iris 240 as in a coaxial combline structure as shown in FIG. 3 at 300. The resonators are still combline-coupled to one another to define a monoblock filter with resonator 330 and input/output coupling metallization at 310 and 315. Further, the metallized through holes in the ceramic block are present at 320 and 325. The back view of the tunable block filter of FIG. 3 is shown generally at 335 with input/out coupling metallization at 340 and 345 and metallized through holes depicted at 350 and 355. Again, the back view of FIG. 3 provides depection of the metallized surface for ground 360.

Figure 4:
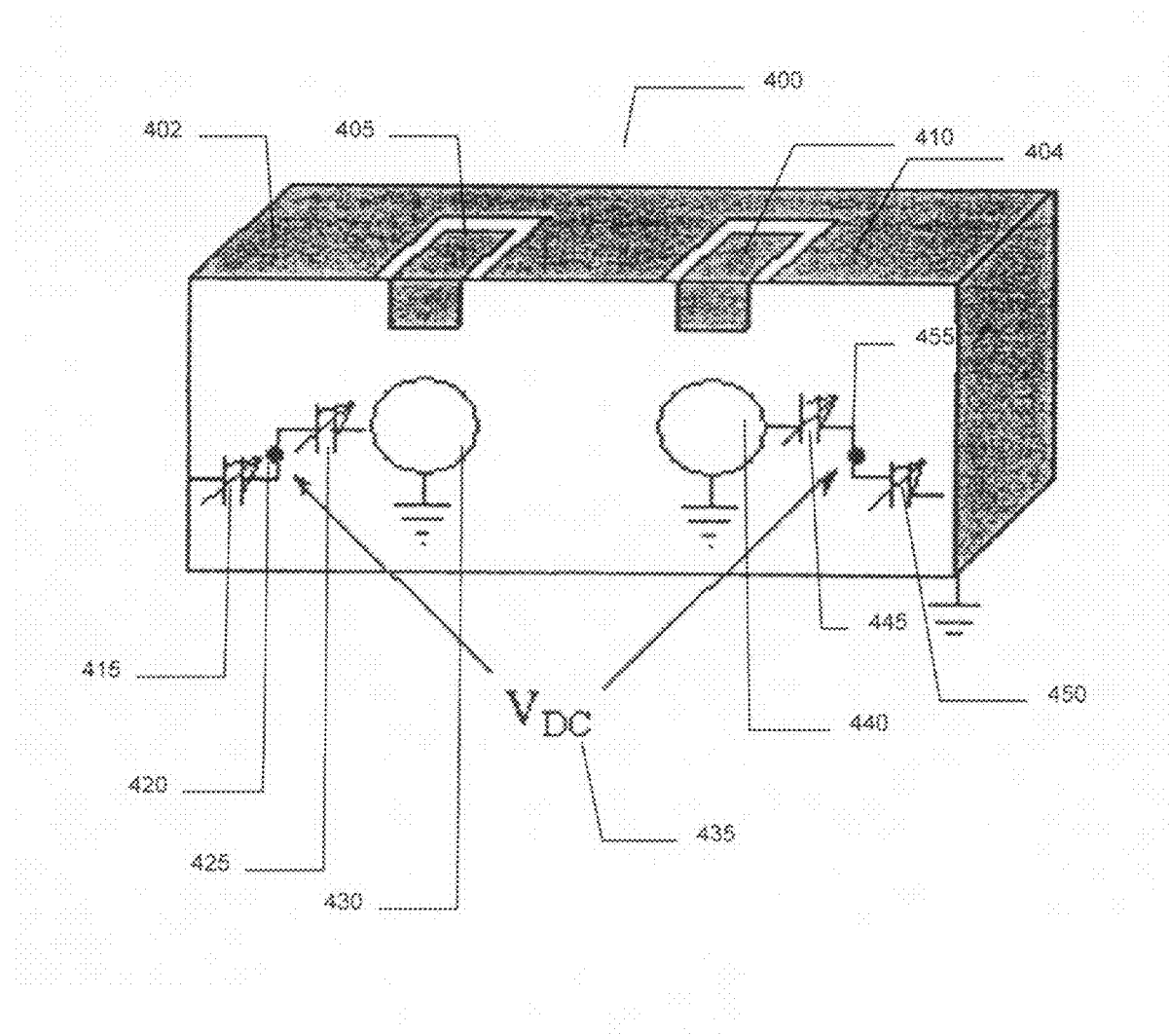
FIG. 4 shows the response of the tunable coaxial combline filter under bias.

FIG. 4 shows an example of two-pole monoblock filter. To provide tunability to this filter, one or two tunable varactors 415, 425, 445 and 450 will be placed near the open end of the resonators 402 and 404. Filters with a higher number of poles will be made by simply adding more resonators between the two shown in FIG. 4. Metallized through holes are provided at 430 and 440. DC bias voltage that can be used for tunable varactors is depicted at 435.

Figure 5:
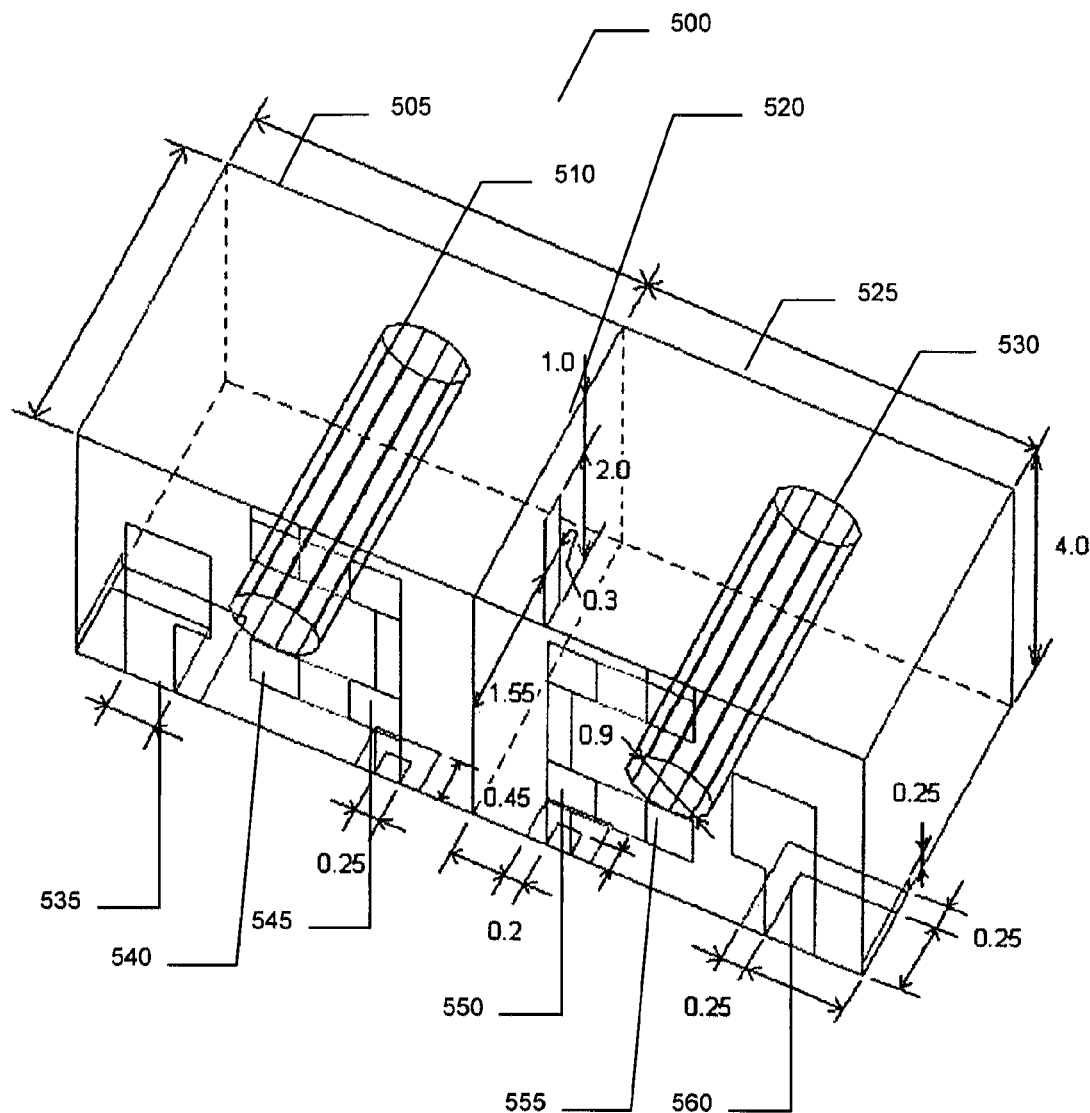
FIG. 5 shows a 3D mechanical block filter that is to be metallized using the photo-definition process.

A 3D mechanical block filter that is to be metallized using the photo-definition process of the present invention is shown in FIG. 5 at 500. Based on this 3D design, one resonator (e.g., 505) would require two sides to be patterned and for the other resonator three sides would require patterning (e.g., 525). As shown more clearly, metallized through holes are shown at 530 and 510. The solder pads used for placement of the optional varactors are depicted at 540, 545, 550 and 555 and the RF ports shown at 535 and 560.

Figure 6:
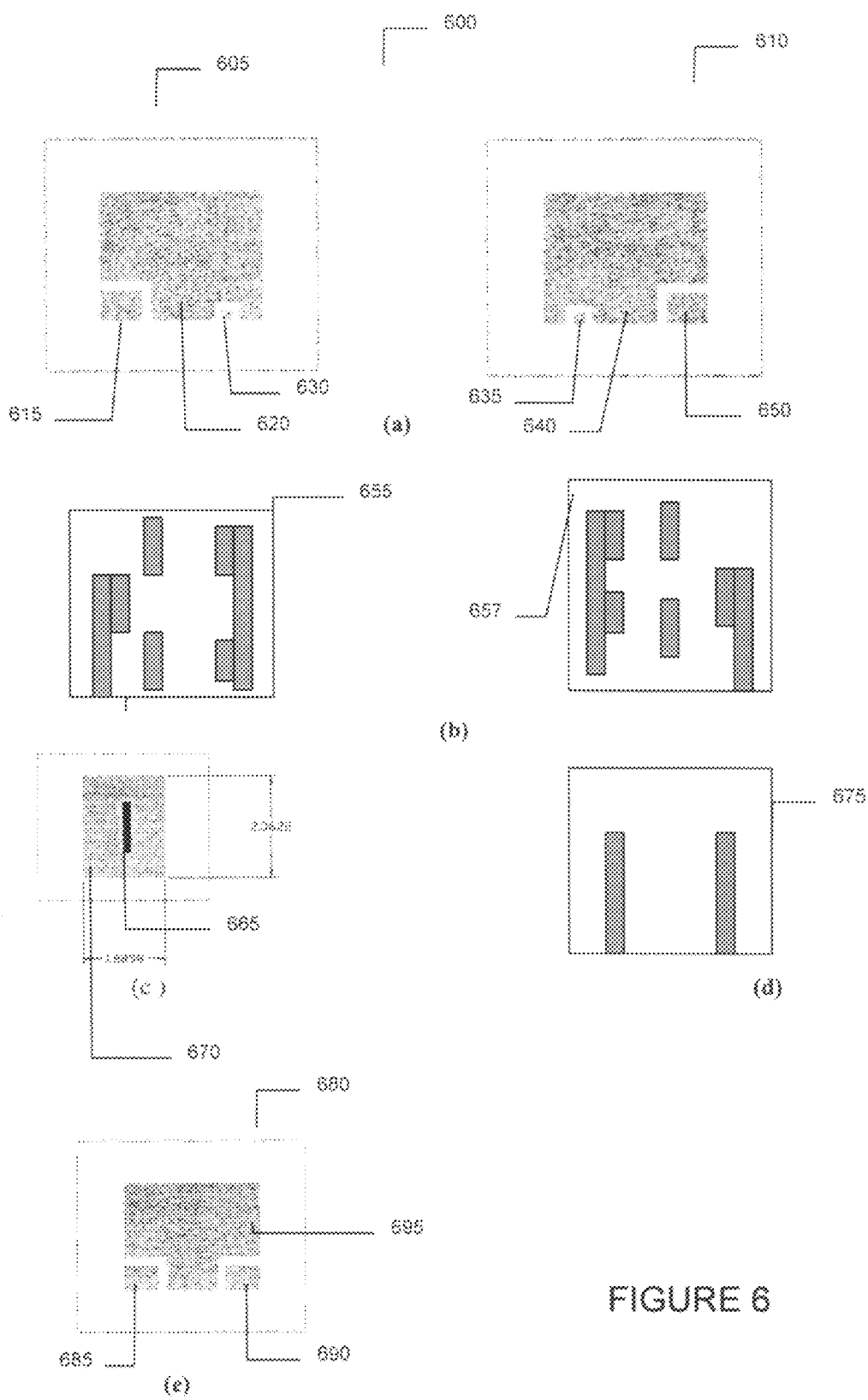
FIG. 6 shows the mask patterns required (a) solder pades for the blocks, (b) mask pattern for coupling lines and varactors mounting pads, (c) aperture window for coupling between clocks (d) coupling lines for a single resonator, (e) solder pads for a single resonator.

FIG. 6a-6e depict the images of the metallization masks required. The shaded area is the indicator for where the metal is applied and the type of metal pattern required. Specifically: 605 shows the mask patterns to generate solder pads; 615 shows the clear area on the mask where it will be metallized with metal for a RF I/O solder pad; 620 shows the clear area on the mask where it will be metallized with metal for ground; 630 shows the clear area on the mask where it will be metallized with metal for the DC bias port; 610 shows the mask patterns to generate solder pads; 635 shows the clear area on the mask where it will be metallized with metal for DC bias port; 640 shows the clear area on the mask where it will be metallized with metal for ground; 650 shows the clear area on the mask where it will be metallized with metal for RF I/O solder pad Turning now to FIG. 6b, 655 shows the mask patterns for coupling lines and varactors mounting pads. In FIG. 6c at 660 is shown the mask pattern to generate aperture window for coupling between clocks; 665 shows the chrome area on the mask where it will be open aperture for coupling; 670 shows the clear area on the mask where it will be metallized with metal for ground. Now looking at FIG. 6d, 675 shows the mask pattern to generate coupling lines for a single resonator.

FIG. 6e at 680 generally depicts a mask pattern to generate solder pads for a single resonator. Specifically: 685 shows a clear area on the mask where it will be metallized with metal for DC bias port; 690 shows a clear area on the mask where it will be metallized with metal for DC bias port; and 695 shows a clear area on the mask where it will be metallized with metal for ground.

In the present preferred embodiment in 6a through 6e the resonators have a profile of 4 mm×4 mm. Typically the resonators that are received from most manufacturers are 3.95 mm in profile with rounded corners. Thus, the camber of the corners caused the actual square area to be about 9.0 mm². The center hole diameter of the preferred embodiment is 0.9 mm although it is understood that diameter size is not crucial to the present invention and alternative sizes can be utilized. Initially, the preferred embodiment of the present invention can have the resonator being obtained with a metallized center through hole and all sides metallized except for the top face. In order to produce the required patterns, one method would be to have the metallization sanded off from two of the sides; however, this step would not be required for production. A basic process to achieve the patterns shown in (a)-(e) that can be used is described as example 1 illustrated below with reference to FIGS. 7, 8, 9 and 10.

Figure 7:
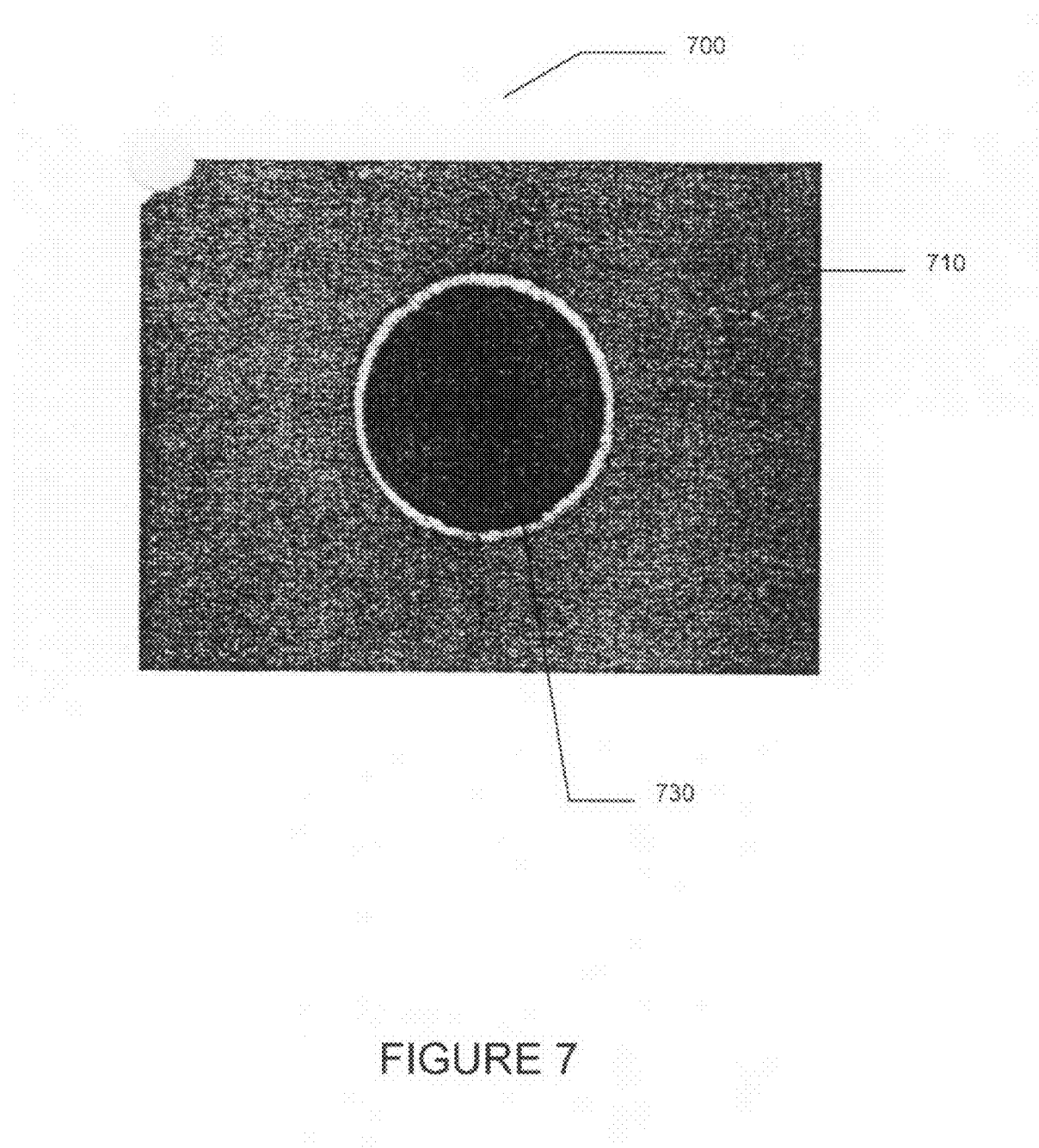
FIG. 7 shows the front face of a block resonator with no pattern and a metallized through hole.

FIGS. 7, 8, 9 and 10 show different views of the final metallized part. FIG. 7 shows the front face 710 of the block resonator 700 prior to patterning. The metallized throughhole is shown at 730.

Figure 8:
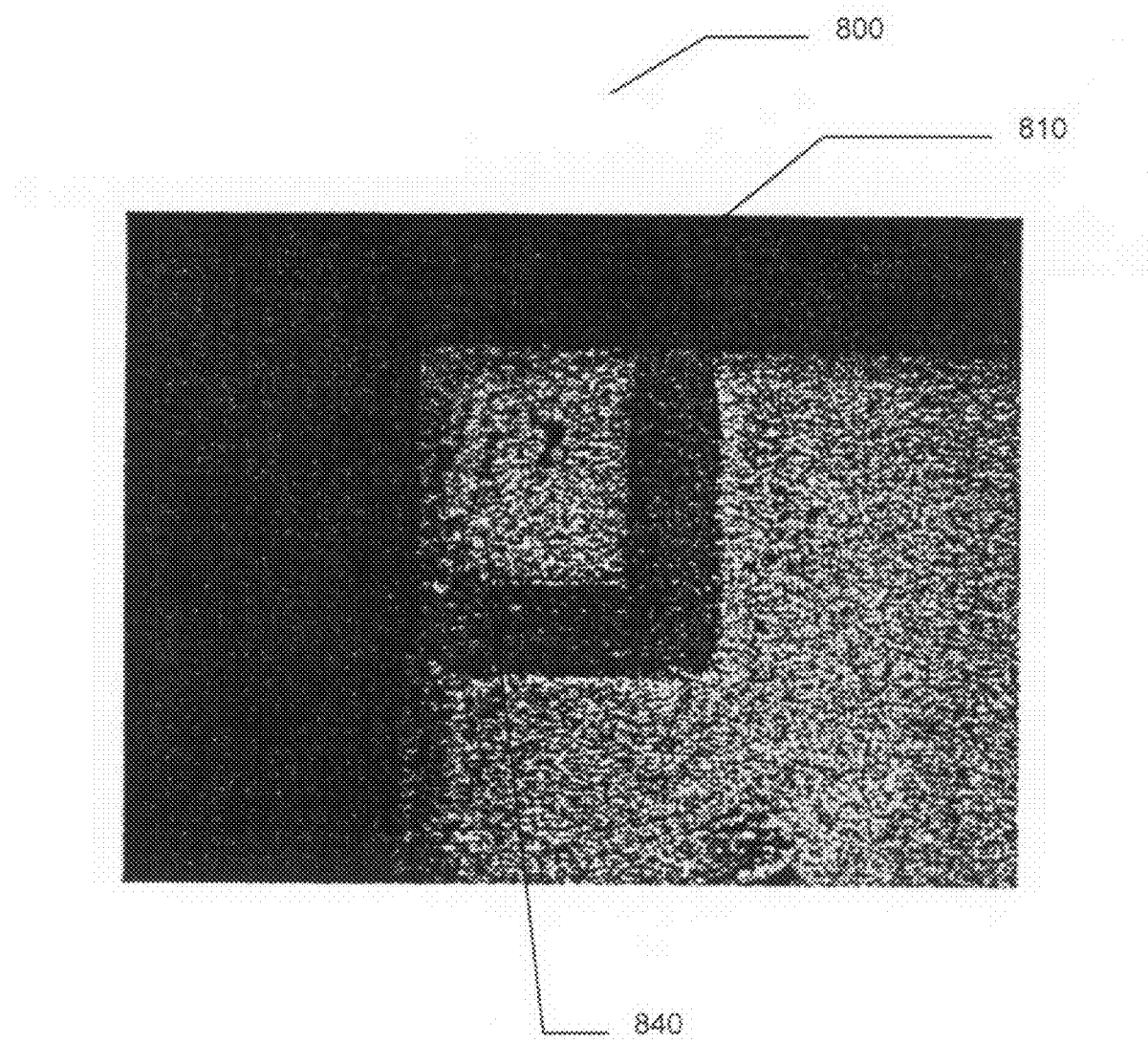
FIG. 8 shows a solder pad on a block filter patterned via a photodefined process.
Figure 9:
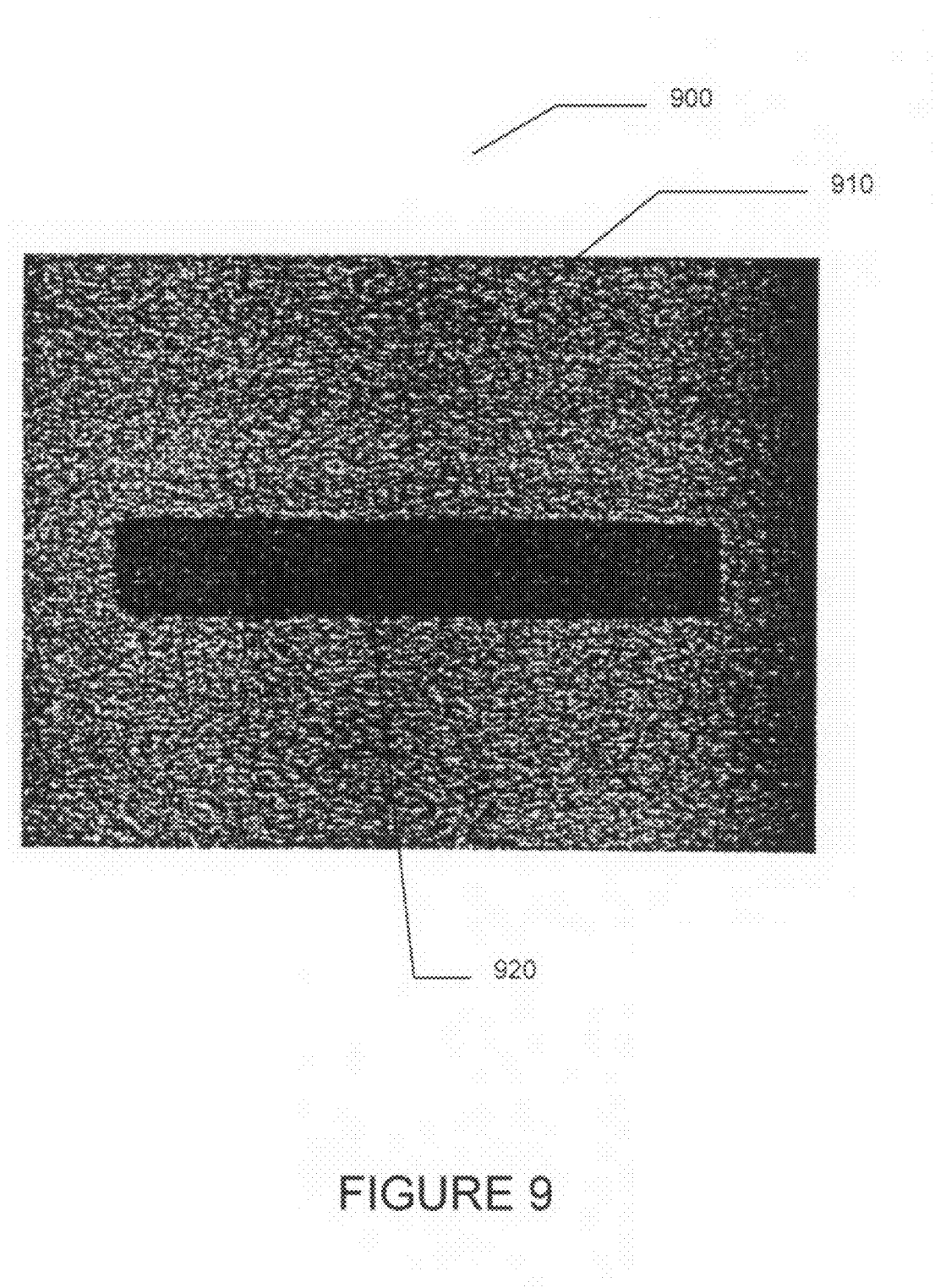
FIG. 9 shows an aperture coupling window on a block filter patterned via a photodefined process.

FIG. 8 shows the bottom face 810 of the block 800 after patterning a solder pad 840. FIG. 9 depicts one side 910 of a block resonator 910 after patterning with an aperture window 920 defined on the surface of face 910.

Figure 10:
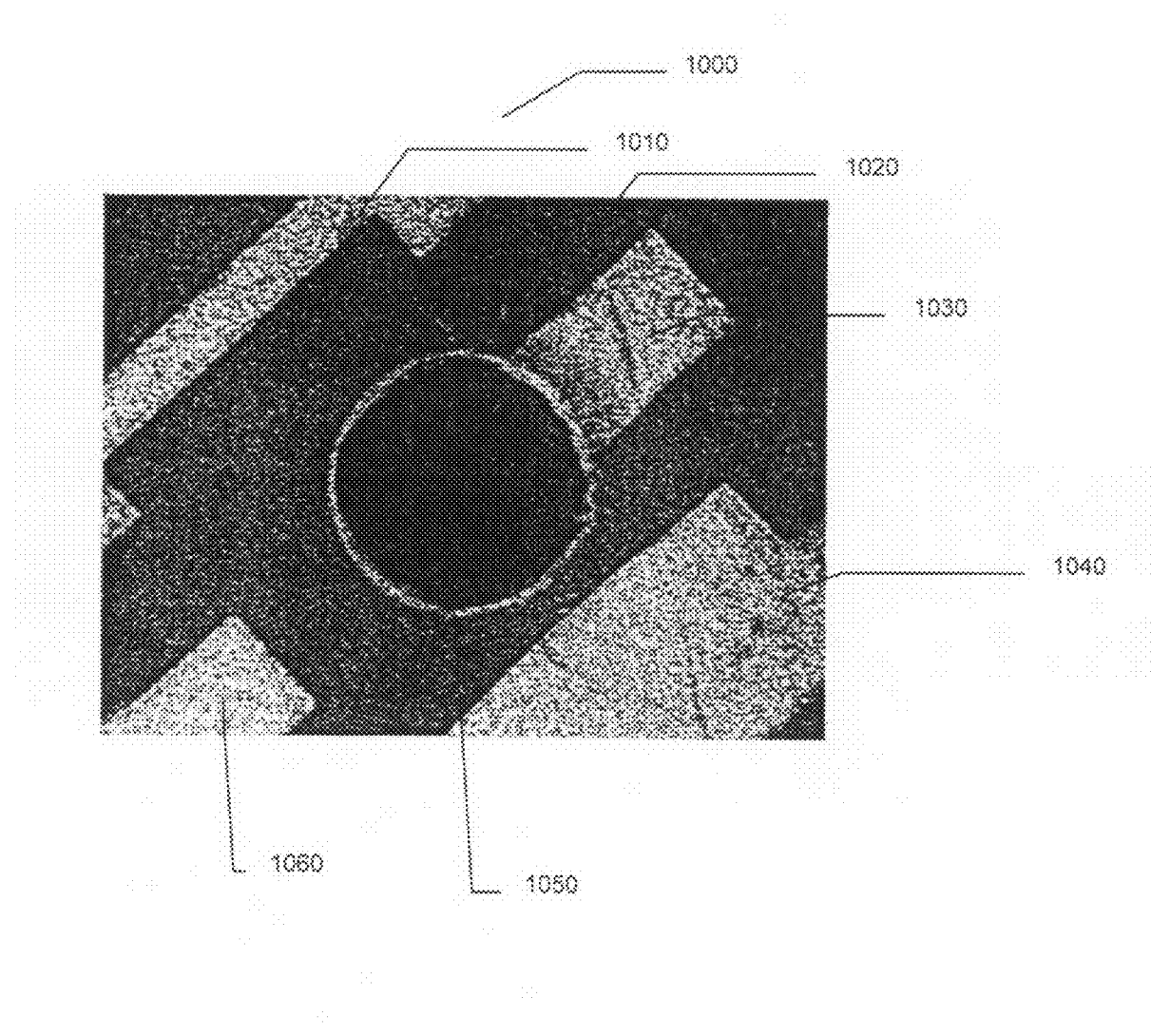
FIG. 10 shows the front face of a block resonator with coupling lines and SMT solder pads patterned via a photodefined process.

Finally, FIG. 10 at 1000 shows the front face 1020 after patterning 1010, 1030, 1040 and 1060 which provide solder points for mountable devices and coupling lines.

Figure 11:
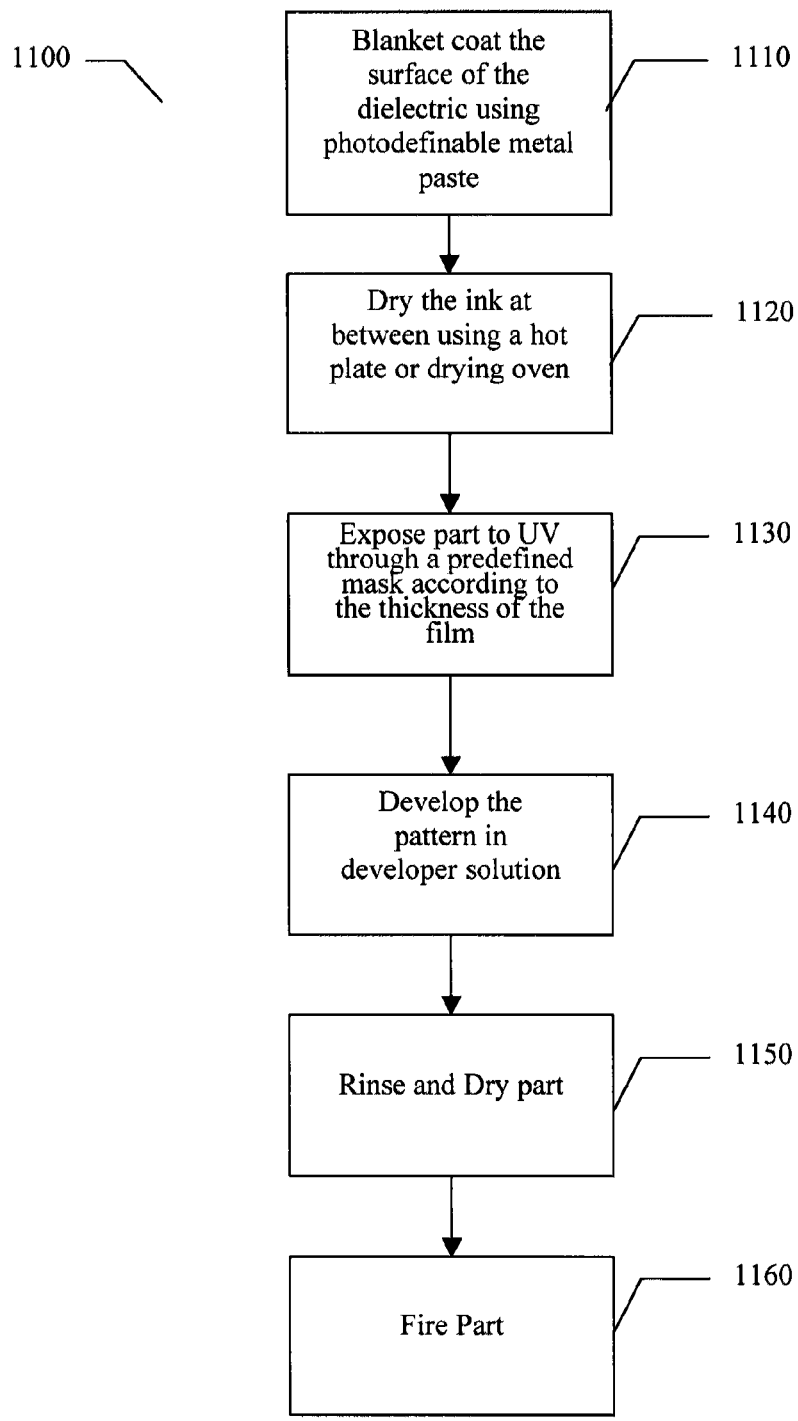
FIG. 11 shows the process flow of the photodefined process.

The process of patterning to provide the metallization of FIGS. 7, 8, 9 and 10 will now be described in greater detail. Thus, the process used to produce the metallization pattern is to photodefine a pattern using photodefinable metal. A typical process flow is shown in FIG. 11, for placing a photodefinable pattern onto a block filter. Using photo-definition as the preferred method allows for the following benefits over the state of the art.

1) As compared to screen printing, the feature size and tolerances achievable is much smaller and more accurate. In fact as frequency increases and filter sizes decrease, the area and metal pad size will need to become smaller and more accurate.

2) As compared to typical semiconductor methods, the process is much simpler and there is no need for the expensive and time consuming vacuum deposition methods. Also, for thin film or vacuum deposited methods such as sputtering and e-beam, the thickness of the metal is limited by the efficiency of the process. Thicker (greater than 3 microns) metals are not usually produced. As compared to an etchable metal process the total time and steps are less. For example, in the case of using an etchable thick film metal, the film would need to be applied by screen printing or dip-coating. The metal is then dried and fired. After this process, photoresist application is performed and exposure to UV through a mask as well as developing of the pattern would be required. Then removal of the metal would be performed with harsher acids such as potassium iodide or cyinide solutions. Then final removal of resist and cleaning (plasma, RIB) would take place. It is possible in the case of harsher chemicals that they may damage the ceramic surfaces in this case post annealing steps may be required to bring the ceramic back to its original properties. Another issue could be getting the photoresist into the through-hole so that the metal is not taken away.

4) In the case of using laser trimming or laser ablation as the method for patterning of the metal, a limitation on the feature size would be the spot size of the laser, usually the smallest sizes achievable is about 50 microns. However, for complex designs on a surface laser patterning is a relatively slow process. The time consumption depends on the amount of power and complexity of the pattern. For higher powers the lasing process actually decreases the quality factor of the resonator and a post annealing step is required to bring the material back to its original value.

In a first embodiment, an overview of the typical process for square block filter metallization patterning using a photodefinable process follows the steps of FIG. 11 at 1100. Elaboration on each step follows below. At step 1110, a blanket coat of the surface of the dielectric using a photo-definable metal paste is accomplished. Next, at step 1120, the ink between is dried using a hot plate or drying oven. Next, at step 1130, part of the surface is exposed to UV through a predefined mask according to the thickness of the film. At step 1140, the pattern is developed in the developer solution and then rinsed and dry the part in step 1150. Finally, in step 1160 the parts fired.

A typical set of processing conditions is shown below. These types of parameters work for metallization of block filters that have square corners, however, filter blocks in most cases will have rounded edges which require some process changes; these changes are considered in the next example.

1) The first step is the application of a photosensitive metal ink. A photosensitive metal ink is an ink which contains metal particles in addition to photosensitive organic compounds. The application of the ink in present application in a preferred embodiment is performed by blanket coating of the metal, a typical way is screen printing.

2) This ink is then dried either in a furnace or hot plate. The drying temperature is between 70C-100c. The drying time is between 5 to 30 min.

3) After the ink is dried, the part is then exposed to UV through a mask; the mask can be positive or negative depending on the nature of the ink. The exposure time is between 40-80 sec depending on the film thickness. The developer time also varies with the development methods—immersion developing, spray developing, puddle developing. In a first embodiment of the present invention was used immersion developing and develop time is around 60 sec.

4) The pattern is now present on the block and ready for firing. A typical firing profile is 30 minutes to 850° C. holding for 10 mins and then cooling the furnace down. The total firing time is about 1.5-2.0 hours.

The final metallization film thickness of this embodiment was measured from the present block filter at about 5 μm. However 8-10 microns is easily achievable.

In the following second preferred embodiment of the present invention, an overview of the typical process for photodefinable metallization is described, which modifies the process described above to allow for a rounded corner blocks.

1) In the screen printing process of this second preferred embodiment was used a finer mesh and thinner emulsion screen. This type of screen provides a more even print and better uniformity around the edges of a resonator. Also, softer squares were used as well as more down stop for uniformity reasons.

2) Drying time was increased to ensure that the ink was uniformly dry. The temperature used was on the higher side of the range at about 95° C.

3) Proximity exposure is used as opposed to contact exposure.

4) 2.5 mol % solution of Sodium Carbonate is used instead of a 0.8-1.0% normally used for flat substrates.

Turning now to FIG. 12 there is shown at 1200 a synopsis of the processing steps required. Process steps 1210 show the step that is being accomplished and whether each of the following is required: photodefined 1220; screen printed 1230; etched 1240; semiconductor patterning 1250; or laser patterning 1260. The chart shows that the total number of steps is less for the photodefinable process. Further, it may not be apparent, but the time required on some of the steps is considerably less than in the other processes. For example, the laser ablation process is a single step but can be time consuming per part. Another example is the vacuum metal deposition which requires time as well. Thus, time required for the process of the present invention is an important benefit.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

All cited patent documents and publications in the above description are incorporated herein by reference.

What is claimed is:

1. A method comprising:
    obtaining a ceramic block comprising a dielectric material;
    applying a photodefinable ink made of a photosensitive metal ink containing metal particles and photosensitive organic compounds to a surface of the dielectric material of said ceramic block to form a photodefinable layer on the surface of the dielectric material of the ceramic block;
    drying the photodefinable layer;
    exposing for a predetermined amount of time a portion of the photodefinable layer to UV radiation through a predefined mask based on a film thickness resulting in an organic-metal particles containing-composition pattern on the surface of the dielectric material of the ceramic block;
    applying a developer solution to an unexposed portion of the photodefinable layer to dissolve the unexposed portion of the photodefinable layer on the surface of the dielectric material of the ceramic block;
    rinsing the organic-metal particles containing-composition pattern on the surface of the dielectric material of the ceramic block; and
    drying the ceramic block having the organic-metal particles containing-composition pattern on the surface of the dielectric material thereof.

2. The method of claim 1, comprising firing the ceramic block having the organic-metal particles containing-composition pattern on the surface of the dielectric material thereof.

3. The method of claim 2, wherein firing time is between 1.5 to 2 hours, and wherein drying time for the photodefinable layer is between 5 to 30 minutes.

4. The method of claim 1, wherein the obtained ceramic block comprises a metalized through-hole, and wherein the organic-metal particles containing-composition pattern is positioned on the surface of the dielectric material of the ceramic block in contact with the metalized through-hole to provide inter-cavity coupling with another organic-metal particles containing-composition pattern positioned on a surface of dielectric material of another ceramic block having another metalized through-hole.

5. The method of claim 1, wherein the organic-metal particles containing-composition pattern on the surface of the dielectric material of the ceramic block is formed without performing chemical etching.

6. The method of claim 1, wherein the organic-metal particles containing-composition pattern on the surface of the dielectric material of the ceramic block is formed without performing trimming to obtain desired dimensions.

7. The method of claim 1, wherein the organic-metal particles containing-composition pattern on the surface of the dielectric material of the ceramic block is formed without performing vacuum metallization.

8. The method of claim 1, wherein the applying of the developer solution is performed utilizing immersion developing.

9. The method of claim 1, wherein the exposing of the portion of the photodefinable layer to the UV radiation through the predefined mask is performed utilizing proximity exposure.

10. The method of claim 1, wherein the organic-metal particles containing-composition pattern on the surface of the dielectric material of the ceramic block is formed without performing annealing after the step of drying the ceramic block.

11. A method comprising:
   obtaining a ceramic block comprising a dielectric material and a metalized through-hole, wherein the metalized through-hole extends entirely through the ceramic block between opposing sides of the ceramic block;
   applying a photodefinable metal paste to a surface of the ceramic block including contact with the dielectric material to form a photodefinable layer on the surface of the ceramic block, wherein the photodefinable metal paste comprises metal particles and photosensitive organic compounds;
   drying the photodefinable layer;
   exposing for a predetermined amount of time a portion of the photodefinable layer to UV radiation through a predefined mask based on a film thickness resulting in an organic-metal particles containing-composition pattern on the surface of the ceramic block that is in contact with the metalized through-hole;
   applying a developer solution to an unexposed portion of the photodefinable layer to dissolve the unexposed portion of the photodefinable layer on the surface of the ceramic block;
   rinsing the organic-metal particles containing-composition pattern on the surface of the ceramic block; and
   firing the ceramic block having the organic-metal particles containing-composition pattern on the surface thereof.

12. The method of claim 11, wherein the organic-metal particles containing-composition pattern is positioned on the ceramic block to provide inter-cavity coupling with another organic-metal particles containing-composition pattern positioned on a surface of another ceramic block that comprises a dielectric material and a metalized through-hole.

13. The method of claim 11, wherein the organic-metal particles containing-composition pattern defines an electrode pattern for at least one of an RF input/output solder pad, a DC bias port, coupling lines or varactor mounting pads.

14. The method of claim 11, wherein the organic-metal particles containing-composition pattern on the surface of the ceramic block is formed without performing chemical etching.

15. The method of claim 11, wherein the organic-metal particles containing-composition pattern on the surface of the ceramic block is formed without performing trimming to obtain desired dimensions.

16. The method of claim 11, wherein the organic-metal particles containing-composition pattern on the surface of the ceramic block is formed without performing vacuum metallization.

17. The method of claim 11, wherein the organic-metal particles containing-composition pattern on the surface of the dielectric material of the ceramic block is formed without performing annealing after the firing step.

18. A method comprising:
   obtaining a ceramic block comprising a plurality of sides, a dielectric material and a metalized through-hole, wherein the metalized through-hole extends entirely through the ceramic block between opposing sides of the plurality of sides of the ceramic block;
   applying a photodefinable metal paste to at least two sides of the plurality of sides of the ceramic block including contact with the dielectric material to form a photodefinable layer on a surface of the dielectric material of the ceramic block, wherein the photodefinable metal paste comprises metal particles and photosensitive organic compounds;
   drying the photodefinable layer;
   exposing for a predetermined amount of time a portion of the photodefinable layer to UV radiation through a predefined mask based on a film thickness resulting in an organic-metal particles containing-composition pattern on the surface of the dielectric material of the ceramic block that is in contact with the metalized through-hole;
   applying a developer solution to an unexposed portion of the photodefinable layer to dissolve the unexposed portion of the photodefinable layer on the surface of the dielectric material of the ceramic block;
   rinsing the organic-metal particles containing-composition pattern on the surface of the dielectric material of the ceramic block; and
   firing the ceramic block having the organic-metal particles containing-composition pattern on the surface of the dielectric material thereof.

19. The method of claim 18, wherein the organic-metal particles containing-composition pattern is positioned on the ceramic block to provide inter-cavity coupling with another organic-metal particles containing-composition pattern positioned on a surface of another ceramic block that comprises a dielectric material.

20. The method of claim 18, wherein the organic-metal particles containing-composition pattern on the surface of the ceramic block is formed without performing: chemical etching, trimming to obtain desired dimensions, vacuum metallization, and annealing after the firing step.

* * * * *